United States Patent [19]

Pauve

[11] Patent Number: 5,780,941
[45] Date of Patent: Jul. 14, 1998

[54] CONTROL CIRCUIT

[75] Inventor: Jan F. Pauve, Espoo, Finland

[73] Assignee: Nokia Telecommunications Oy, Espoo, Finland

[21] Appl. No.: 750,057

[22] PCT Filed: Jun. 1, 1995

[86] PCT No.: PCT/FI95/00311

§ 371 Date: Feb. 12, 1997

§ 102(e) Date: Feb. 12, 1997

[87] PCT Pub. No.: WO95/34131

PCT Pub. Date: Dec. 14, 1995

[30] Foreign Application Priority Data

Jun. 3, 1994 [FI] Finland ................... 942636

[51] Int. Cl.$^6$ ........................ H01H 3/00
[52] U.S. Cl. ................ 307/139; 307/125; 526/39
[58] Field of Search ................ 326/39, 40, 41, 326/47; 307/112, 116, 125, 139, 140

[56] References Cited

U.S. PATENT DOCUMENTS

| | | | |
|---|---|---|---|
| 4,031,408 | 6/1977 | Holz | 307/116 |
| 4,549,094 | 10/1985 | Floyd | 327/386 |
| 4,611,127 | 9/1986 | Ibrahim et al. | 307/116 |
| 4,677,318 | 6/1987 | Veenstra | 326/40 |
| 4,731,548 | 3/1988 | Ingraham | 307/116 |
| 5,615,107 | 3/1997 | DeAngelis | 364/141 |
| 5,642,104 | 6/1997 | Erwin | 340/825.72 |

FOREIGN PATENT DOCUMENTS

| 568 342 | 11/1993 | European Pat. Off. . |
|---|---|---|
| 2 241 064 | 8/1991 | United Kingdom . |

*Primary Examiner*—William M. Shoop, Jr.
*Assistant Examiner*—Jonathan Kaplan
*Attorney, Agent, or Firm*—IP Group of Pillsbury Madison & Sutro LLP

[57] ABSTRACT

A control circuit for manual forced control of a unit, this circuit including a manually operated switch of a non-locking type, to eliminate the need for visual examination. The switch returns to its initial state when the manual force applied to it has been ended. The control circuit includes a first switch having a first input for receiving a control pulse actuated by the use of the switch manually operated switch, a set input for receiving a set signal, an output connected to the unit which is to be controlled, changing its state to a predetermined set state in response to a set signal, changing its state in response to a control pulse, and remaining in the same state until a following control pulse or set signal is inputted.

5 Claims, 2 Drawing Sheets

CONTROL CIRCUIT

This application is the national phase of international application PCT/FI95/00311 filed Jun. 1, 1995 which designated the U.S.

BACKGROUND OF THE INVENTION

This invention relates to a control circuit for manual forced control of a unit, this circuit including a manually operated switch. Forced control refers herein to apparatus and a procedure for use in which the operator may manually activate or correspondingly deactivate a certain unit at a desired moment, and thus bypass, e.g. the automatic control system that normally controls the unit.

A solution is previously known for enabling forced control of a unit in which solution a manual push button-switch is provided along with the unit. In the previously known solution, the push button-switch is of a locking type, so it will remain permanently in another position subsequent to being pushed, simultaneously maintaining forced control active. When the push button-switch is pushed again, will return to its initial position, and the force controlled unit will also return to its initial state.

The most significant drawback of this prior art solution is that the position of the push button-switch must be examined on the basis of a visual estimate when the unit is assembled, so that the forced control will not remain switched on unintentionally. E.g., in systems having a unit backing up another unit, malfunctions may occur in the operation of the unit (the active unit), and, of course the unit will not obey the automatic control system if the push button-switch is in forced control on -position when the unit is assembled. If a unit has a central position in a system, an unintentional on -state of forced control may break down the system. In addition, visual examining requires time, since the operator of the unit must control the position of the push button-switch of each unit one by one. In order to facilitate visual examining, it has been necessary to increase the size of the push button-switch to better distinguish the switch and its position. Due to the larger size, physical placing of the push buttonswitch causes problems.

SUMMARY OF THE INVENTION

The object of this invention is to solve the above-mentioned problem and provide a control circuit for forced control of a unit, in which circuit no visual checks are required when the unit is assembled. This is achieved with a control circuit of the invention, in which the switch is of a non-locking type, and therefore is able to return to its initial position when the manual use directed to it has ended. The the control circuit includes a first switch means having: a first input for receiving the control pulse actuated by the use of the switch; a set input for receiving a predetermined set signal; and an output to which the circuit is responsive, and which is adapted to change its state to a predetermined set state in response to a set signal, and to change its state between the set state and another alternative state in response to a control pulse, and to remain in the same state until the following control pulse or set signal is inputted.

The invention is based on the idea that when forced control is carried out by using a control circuit with no mechanically locking components, the unintentional on-state of forced control may be avoided, and visual examining is not necessary during the initialization of the unit. The most significant advantages of the control circuit of the invention are thus a reduced need for examining, since forced control may automatically be switched off during the initialization, as well as space saving as the push button-switch no longer needs to be large and easily distinguishable. Furthermore, the control circuit of the invention is very inexpensive and small, owing to which it is suited for a variety of applications.

In a preferred embodiment of the control circuit of the invention, a manually operated switch includes a break circuit and a make circuit, and the control circuit includes a second switch means. In this case, the second switch, preferably an SR-type flip-flop, is adapted to feed a control pulse to the input of the first switch means since the make circuit is closed, until the break circuit of the switch is closed. It is thus ensured that only a single control pulse is generated by one push of the push-button switch, although so called on/off -oscillation would be caused by pushing the switch. To generate a second, new control pulse requires that the push-button switch being completely released to the upper position.

The control circuit of the invention is extremely advantageous when it is utilized for two parallel units, the control circuits of the units being responsive to each other in such a way that activating the forced control of the first unit automatically switches off the possible forced control of the second unit. This kind of switching off is easily achieved by using the control circuit of the invention in a combination in which the inverted output of the second switch of the second unit is adapted to feed control pulses to the set input of the first switch of the second unit.

BRIEF DESCRIPTION OF THE DRAWINGS

The invention will be described in closer detail by means of a few preferred embodiments of the invention, referring to the attached figures, in which.

DETAILED DESCRIPTION

Figure 1:
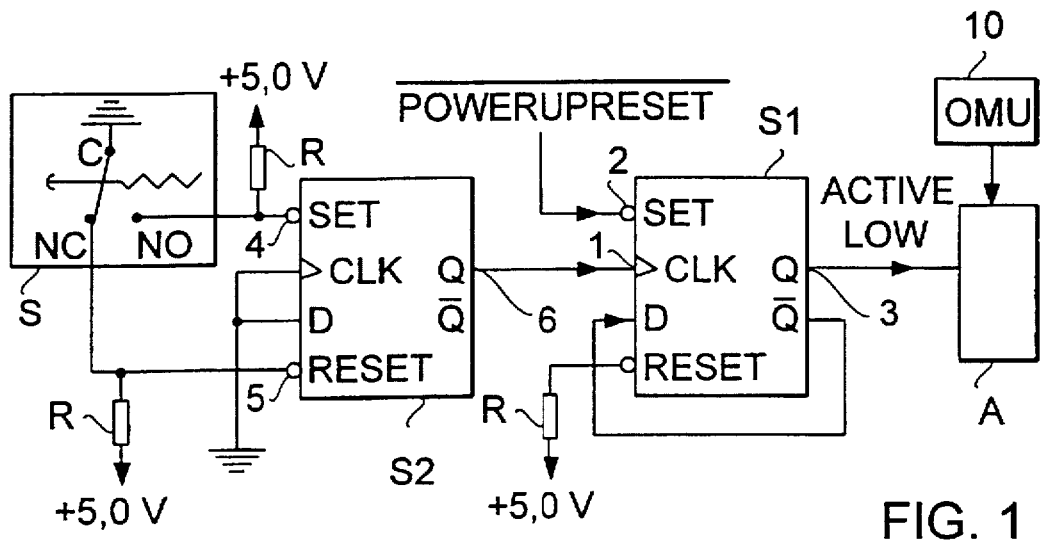
FIG. 1 illustrates a first preferred embodiment of the control circuit of the invention.

FIG. 1 illustrates the first preferred embodiment of the control circuit of the invention. A Unit A shown in FIG. 1 is controlled by means of a control system (OMU) 10. The unit A may be any automatically controlled unit which must occasionally be able to be activated by means of forced control, e.g. due to service measures. The unit A may, however, be force controlled, if necessary, the term "force controlled " force controlled referring herein to switching the unit on regardless of the control system 10. A push-button switch S reversible by means of a spring and two switch means, i.e. a T-type flip-flop S1 and an SR-type flip-flop S2 are provided at the unit A for forced control.

A first (common) pole C of the push-button switch is grounded. Its normally closed pole (NC) is connected to the zeroing or reset input (RESET) 5 of the second switch means S2 via a logical inversion device (that converts a logical one into a logical zero and vice versa), which is illustrated in FIG. 1 by a circle marked at interface 5. Similarly, the normally open pole (NO) of the push-button switch is switched in a zero-active state to the set input (SET) 4 of the second switch means. The push-button switch S thus comprises one break circuit (C-NO) and one make circuit (C-NC).

Pull-up resistors R (e.g. 2.2 kΩ) are switched between the push-button switch S and the inputs 4 and 5 of the second switch means S2. The second switch means shown in FIG. 1 is a flip-flop of the type 74AC74, which has been converted into an SR-type flip-flop by grounding its clock input CLK and data input D. The state of the output 6 (Q) of the SR-type flip-flop thus totally depends on the state of its set input (SET) and its reset input (RESET).

In the situation shown by FIG. 1, the state of output 6 of the second switch means S2 is "0". When the switch S is pushed down, the state of output 6 is correspondingly "1". After this, output 6 will remain in state "1" until the switch S is totally in "upper" position, i.e. it has returned to the position shown in FIG. 1, whereby its make circuit (C-NC) will cause zeroing of the SR-type flip-flop, and output 6 will be set in state "0". It is thus ensured that only a single control pulse is generated by one push of the pushbutton switch, although on/off -oscillation would be caused by pushing the switch S.

The first switch means S1 shown in FIG. 1 is also a flip-flop of the type 74AC74, but it has been converted into a T-type flip-flop by switching its inverted output Q to its data input D and by switching the pull-up resistor R (e.g. 2.2 k$^4$) to its reset input (RESET) via a logical inversion means.

The output 6 of the second switch means S2 is adapted to feed control pulses to the input 1 of the first switch means S1, which input is the clock input (CLK) of the flip-flop. The output 3 of the first switch means S1 thus changes its state between a logical zero and a logical one in response to each pulse (i.e. positive edge) fed to its input 1. The unit A shown in FIG. 1 is active due to the forced control of the control circuit when the state of the output 3 of the first switch means S1 is "0".

The first switch means S1 is responsive to the initial zeroing signal (POWERUPRESET) via set input 2 (SET). When the unit is assembled to the system, the initial zeroing signal (POWERUPRESET) remains in state "0" for a predetermined time, which prevents unintentional activating of forced control when the operating voltage is being switched on (i.e. output 3 will remain in state "1"). Upon expiration of the predetermined time, set input 2 goes to state "1", and the output 3 of the first switch means S1 is responsive to the pulses fed to its clock input 1.

Figure 2:
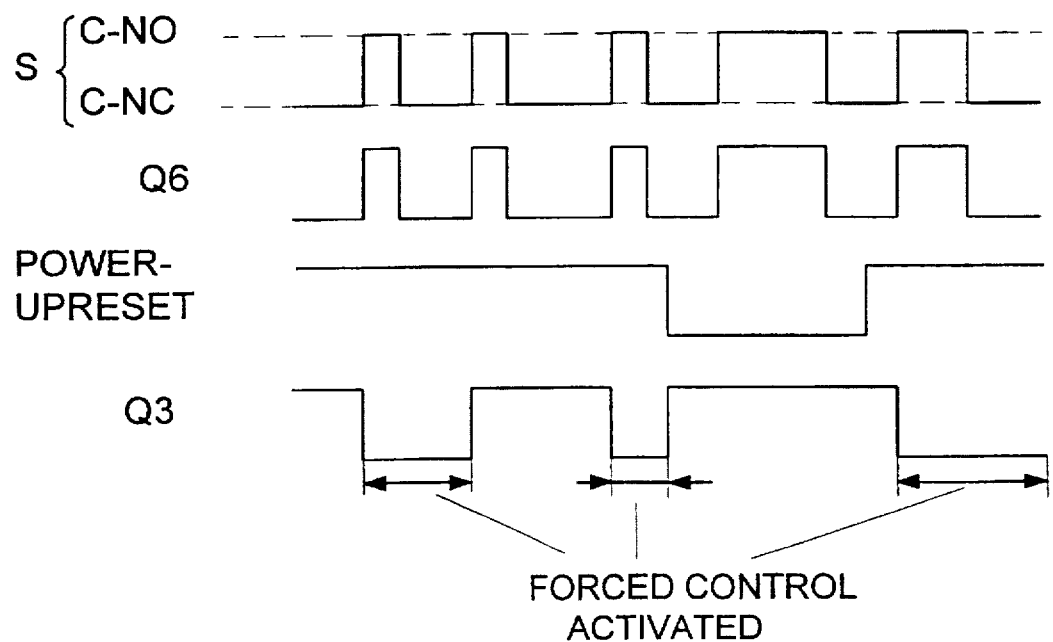
FIG. 2 illustrates the signals occurring in the control circuit of FIG. 1.

FIG. 2 shows the signals occurring in the control circuit of FIG. 1. The curve S in FIG. 2 represents the position of the push-button switch, i.e. which one of the circuits C-NO/C-NC is closed. Curve Q6 illustrates the state of the output 6 of the second switch means. Curve Q3 illustrates the state of the output 3 of the first switch means. The POWERUPRESET curve in FIG. 2 represents the state of the initial zeroing signal. It appears from FIG. 2 that the output 3 of the first switch means is responsive to the push-button switch S, so that every second push of the push-button switch switches forced control on, and every second push switches forced control off as long as the initial zeroing signal POWERUPRESET is in state "1". When the initial zeroing signal is set to state "0", output Q3 will go to state "1", in which it will remain until the initial zeroing signal goes to state "0" and the push-button switch is pushed.

Figure 3:
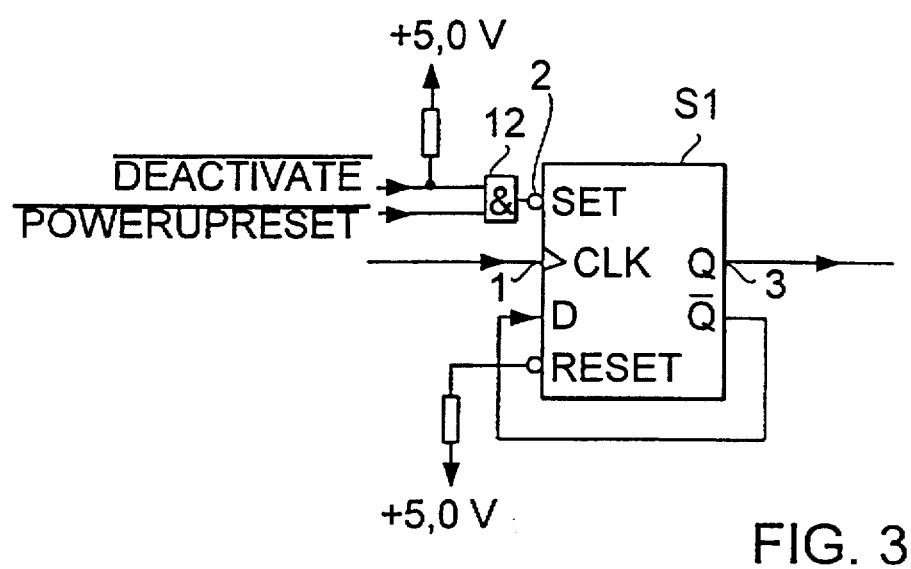
FIG. 3 illustrates a second preferred embodiment of the control circuit of the invention.

FIG. 3 illustrates a second preferred embodiment of the control circuit of the invention. The alternative embodiment of the control circuit of the invention shown in FIG. 3 may be applied when the force controlled unit is doubled, i.e. when two similar units are connected parallel so that one unit may be used when the other one is out of use. The units may be in e.g. units located in telephone exchanges or similar devices, said units being connected parallel so that when one unit is broken, the operation of a telephone exchange may be ensured by switching the other unit to replace the broken unit, preferably by means of hot standby operation. In telephone exchanges, e.g., the generator circuits that generate a clock signal are typically doubled.

FIG. 3 shows a switch means S1 which completely corresponds to the switch means S1 shown in FIG. 1, with the exception, however, that an AND-gate 12 is switched to the set input 2 of the switch means S1 in FIG. 3. As appears from FIG. 3, the initial zeroing signal (POWERUPRESET) is fed via AND-gate the 12. The second input of the AND-gate 12 is used for feeding a deactivating signal (DEACTIVATE), by means of which the forced control of the unit connected to switch means S1 can be switched off.

The deactivating signal (in which case the deactivating signal goes from the logical level "1" to the logical level "0") is preferably generated by the control circuit of the parallel unit simultaneously when the forced control is being activated, in which case it is possible to ensure that the parallel/doubled units cannot be in forced control on-state at the same time. The deactivating signal may naturally be generated in some other way, as well.

In the second embodiment of the control circuit of the invention, forced control may thus be deactivated with the push-button switch belonging to the unit itself, or by activating forced control in the parallel unit with the push-button switch belonging to the parallel unit.

It should be understood that the above description and the figures associated therewith are only intended to illustrate the present invention. Different variations and modifications will be obvious for persons skilled in the art, without deviating from the scope of the protection and the spirit of the invention set forth in the attached claims.

I claim:

1. A control circuit for manual, forced control of a unit, comprising:

a non-locking, manually operated switch which returns to an initial position when actuating force directed thereto has ended; said manually operated switch including a break circuit and a make circuit;

a first switch means, comprising:

a first input for receiving a control pulse actuated by applying actuating force to said manually operated switch;

a set input for receiving a predetermined set signal; and an output to said unit, for causing said unit to change state to a predetermined set state in response to provision to said unit of said set signal, and to change state between said set state and an alternative state in response to provision to said unit of said control pulse, and to remain in a same state until provision to said unit by said output of a respective following control pulse or set signal; and a second switch means having a set input which is responsive to said make circuit of said manually operated switch, a reset input which is responsive to said break circuit of said manually operated switch, and for feeding a control pulse to said first input of said first switch means from when said make circuit of said manually operated switch is closed, until said break circuit of said manual operated switch is closed.

2. The control circuit as claimed in claim 1, wherein:

said first switch means is a T-type flip-flop.

3. The control circuit as claimed in claim 1, wherein:

said second switch means is an SR-type flip-flop.

4. The control circuit as claimed in claim 1, further comprising:

means for receiving a deactivating signal and for feeding said deactivating signal to said set input of said first switch means, for setting said first switch means in said predetermined set state.

5. The control circuit as claimed in claim 4, for additionally controlling a second unit connected in parallel with said unit, further comprising:

a third switch means, comprising:

a first input for receiving a control pulse actuated by applying actuating force to said manually operated switch;

a set input for receiving a predetermined set signal; and an output to said second unit, for causing said second unit to change state to a predetermined set state in response to provision to said second unit of said set signal, and to change state between said set state and an alternative state in response to provision to said second unit of said control pulse, and to remain in a same state until provision to said second unit by said output of a respective following control pulse or set signal; and a fourth switch means having a set input which is responsive to said make circuit of said manually operated switch, a reset input which is responsive to said break circuit of said manually operated switch, and an output for feeding a control pulse to said first input of said third switch means from when said make circuit of said manually operated switch is closed, until said break circuit of said manually operated switch is closed, said control circuit being arranged to generate said deactivating signal for said second unit in response to manual forced control of said unit.

* * * * *